United States Patent
Thomas, III et al.

(10) Patent No.: US 7,368,764 B1
(45) Date of Patent: May 6, 2008

(54) HETEROJUNCTION BIPOLAR TRANSISTOR AND METHOD TO MAKE A HETEROJUNCTION BIPOLAR TRANSISTOR

(75) Inventors: Stephen Thomas, III, Redondo Beach, CA (US); Kenneth Robert Elliott, Thousand Oaks, CA (US); David Chow, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 157 days.

(21) Appl. No.: 11/109,288

(22) Filed: Apr. 18, 2005

(51) Int. Cl.
  *H01L 29/06* (2006.01)
(52) U.S. Cl. .............................. 257/197; 257/E29.033; 438/312; 438/320
(58) Field of Classification Search ................ 257/197, 257/198; 438/320, 312
  See application file for complete search history.

(56) References Cited

U.S. PATENT DOCUMENTS

| | | | |
|---|---|---|---|
| 5,098,853 A | 3/1992 | Clark et al. ................. 437/31 |
| 5,159,423 A | 10/1992 | Clark et al. ................. 357/34 |
| 5,272,095 A | 12/1993 | Enquist et al. ............... 437/31 |
| 5,318,916 A | 6/1994 | Enquist et al. ............... 437/31 |
| 5,486,483 A | 1/1996 | Lammert ..................... 437/39 |
| 5,610,085 A | 3/1997 | Yuan et al. .................. 437/29 |
| 5,641,975 A | 6/1997 | Agarwal et al. .............. 257/76 |
| 5,648,666 A | 7/1997 | Tran et al. .................. 257/197 |
| 5,665,614 A | 9/1997 | Hafizi et al. ................ 438/320 |
| 5,672,522 A | 9/1997 | Streit et al. ................. 437/31 |
| 5,705,825 A * | 1/1998 | Ando ........................... 257/25 |
| 5,804,487 A | 9/1998 | Lammert ..................... 438/319 |
| 5,903,018 A | 5/1999 | Shimawaki ................. 257/198 |
| 6,573,539 B2 | 6/2003 | Huang ......................... 257/197 |
| 6,855,948 B2 | 2/2005 | Chow et al. ................. 257/18 |
| 6,873,029 B2 | 3/2005 | He et al. ..................... 257/586 |
| 2001/0013635 A1 | 8/2001 | Kitahata .................... 257/565 |
| 2003/0166325 A1* | 9/2003 | Chow et al. ................. 438/311 |

OTHER PUBLICATIONS

Wei et al. "280 BHz fT InP DHBT with 1.2 micronΛ2 base emitter junction area in MBE Regrown-Emitter Technology," Device Research Confrence, 2004, 62nd DRC, Confrence Digest [Late News Papers volume included], Jun. 23, 2004 pp. 237-238 vol. 1.*
U.S. Appl. No. 10/854,680, filed May 25, 2004, Thomas, III et al.

(Continued)

*Primary Examiner*—Chandra Chaudhari
*Assistant Examiner*—Matthew L. Reames
(74) *Attorney, Agent, or Firm*—Ladas & Parry (57) ABSTRACT

A heterojunction bipolar transistor and a method of making a heterojunction bipolar transistor. The heterojunction bipolar transistor includes: a regrown emitter region; an intrinsic base region forming a junction with the regrown emitter region; and an extrinsic base region separated from the regrown emitter region. The thickness of the extrinsic base region is greater than the thickness of the intrinsic base region.

19 Claims, 5 Drawing Sheets

OTHER PUBLICATIONS

Arai, T., et al., "Reduction of Base-Collector Capacitance in Submicron InP/GaInAs Heterojunction Bipolar Transistors with Buried Tungsten Wires," *Jpn. J. Appl. Phys.*, vol. Part 2, No. 7B, pp. L735-L737 (Jul. 15, 2001).

Averett, K.L., et al. "Low-Voltage InAsP/InAs HBT and Metamorphic InAs BJT Devices Grown By Molecular Beam Epitaxy," *Journal of Crystal Growth*, vol. 251, pp. 852-857 (2003).

Miyamoto, Y., et al., "Reduction of Base-Collector Capacitance in GaInAs/InP Heterojunction Bipolar Transistor By Using InP Buried Growth of Tungsten," *Department of Physical Electronics*, Tokyo Institute of Technology, 4 pages total (2001).

Rieh, J.S., et al., "SiGe HBTs With Cut-Off Frequency of 350GHz," *IEEE International Electron Devices Meeting Digest*, pp. 771-774 (2002).

Sun, M., et al., "A Non-Self Aligned InP HBT Production Process," *GasMANTECH Conference*, 4 pages total (2002).

\* cited by examiner

| | |
|---|---|
| EXTRINSIC CAP | 910 |
| EXTRINSIC BASE | 810 |
| ETCH STOP | 710 |
| EMITTER (1) | 610 |
| BASE | 510 |
| COLLECTOR | 410 |
| CONTACT | 310 |
| BUFFER | 210 |
| SUBSTRATE | 110 |

FIG. 1

| | |
|---|---|
| EXTRINSIC CAP | 920 |
| EXTRINSIC BASE | 820 |
| ETCH STOP | 720 |
| BASE (1) | 520 |
| COLLECTOR | 420 |
| CONTACT | 320 |
| BUFFER | 220 |
| SUBSTRATE | 120 |

FIG. 3

| 910 | | | | |
|---|---|---|---|---|
| 810 | Extrinsic cap | InAsSb(p+) | 2.0E+19 | 100A |
| 710 | Extrinsic base | InAs (p+) | 2.0E+19 | 900A |
| 610 | Etch stop | GaSb(p+) | 5.0E+19 | 50A |
| | Emitter (1) | InAsP(n) | 1.0E+17 | 100A |
| | Base | InAs (p+) | 2.0E+19 | 250A |
| | Collector | InAs (n) | 2.0E+16 | 2000A |
| | Contact | InAs (n+) | 1.0E+19 | 3000A |
| | Buffer | InP | ud | 500A |
| | InP Substrate | | | |

| 920 | | | | |
|---|---|---|---|---|
| 820 | Extrinsic cap | InAsSb(p+) | 2.0E+19 | 100A |
| 720 | Extrinsic base | InAs (p+) | 2.0E+19 | 900A |
| | Etch stop | GaSb(p+) | 5.0E+19 | 50A |
| | Base (1) | InAs (p+) | 2.0E+19 | 150A |
| | Collector | InAs (n) | 2.0E+16 | 2000A |
| | Contact | InAs (n+) | 1.0E+19 | 3000A |
| | Buffer | InP | ud | 500A |
| | InP Substrate | | | |

HETEROJUNCTION BIPOLAR TRANSISTOR AND METHOD TO MAKE A HETEROJUNCTION BIPOLAR TRANSISTOR

STATEMENT OF GOVERNMENT INTEREST

This invention was made with government support and the government has certain rights in the invention.

BACKGROUND

1. Field

The present disclosure relates to a heterojunction bipolar transistor (HBT) and a method to make a heterojunction bipolar transistor.

2. Related Art

U.S. patent application Ser. No. 10/854,680, also assigned to the assignee of the present application and incorporated herein by reference in its entirety, discloses a self-aligned regrown emitter HBT.

U.S. Pat. No. 6,855,948, also assigned to the assignee of the present application and incorporated herein by reference in its entirety, discloses a low Vbe HBT.

U.S. Pat. No. 6,573,539 describes an HBT with a silicon-germanium base.

J. S. Rieh et al., IEEE International Electron Devices Meeting Digest, 2002 (p. 771), "SiGe HBTs with Cutoff frequency of 350 GHz" also describes a silicon-germanium HBT.

K. L. Averett et al., J. Crystal Growth, Vol. 251, pp. 852-857 (2003), "Low Voltage InAsP/InAs HBT and metamorphic InAs BJT devices grown by molecular beam epitaxy" describes an HBT structure with a low Vbe.

SUMMARY

According to a first aspect, a heterojunction bipolar transistor is provided, comprising: a collector region; a base region made of a III-V semiconductor, above the collector region; a first emitter region above the first base region; a second emitter region above the first emitter region; an extrinsic region outside the second emitter region and above the first emitter region, the extrinsic region comprising: an etch stop region; an extrinsic base region; and an extrinsic cap region.

According to a second aspect, a heterojunction bipolar transistor is provided, comprising: a collector region; a first base region made of a III-V semiconductor, above the collector region; a second base region made of a III-V semiconductor, above the first base region; an emitter region above the second base region; an extrinsic region outside the emitter region and above the first base region, the extrinsic region comprising: an etch stop region; an extrinsic base region; and an extrinsic cap region.

According to a third aspect, a method for fabricating a heterojunction bipolar transistor is provided, comprising: i) epitaxially growing a first layer sequence, the first layer sequence comprising: a collector layer; a base layer made of a III-V semiconductor, above the collector layer; a first emitter layer above the base layer; an etch stop layer above the first emitter layer; an extrinsic base layer above the etch stop layer; and an extrinsic cap layer above the extrinsic base layer, ii) etching away a portion of the first layer sequence thereby forming an etched away portion and a non-etched away portion of the first layer sequence, the etched away portion comprising: a portion of the etch stop layer; a portion of the extrinsic base layer; and a portion of the extrinsic cap layer, iii) epitaxially growing a second layer sequence, the second layer sequence comprising: a second emitter layer above the first emitter layer; and a contact layer above the second emitter layer.

According to a fourth aspect, a method for fabricating a heterojunction bipolar transistor is provided, comprising: i) epitaxially growing a first layer sequence, the first layer sequence comprising: a collector layer; a first base layer made of a III-V semiconductor compound, above the collector layer; an etch stop layer above the first base layer; an extrinsic base layer made of a III-V semiconductor compound, above the etch stop layer; and an extrinsic cap layer above the extrinsic base layer, ii) etching away a portion of the first layer sequence thereby forming an etched away portion and a non-etched away portion of the first layer sequence, the etched away portion comprising: a portion of the etch stop layer; a portion of the extrinsic base layer; and a portion of the extrinsic cap layer, iii) epitaxially growing a second layer sequence, the second layer sequence comprising: a second base layer above the first base layer; an emitter layer above the second base layer; and an emitter contact layer above the emitter layer.

According to a fifth aspect, a heterojunction bipolar transistor is provided, comprising: a regrown emitter region; an intrinsic base region comprising a III-V semiconductor compound, forming a junction with the regrown emitter region, the intrinsic base region having an intrinsic base region thickness; and an extrinsic base region comprising a III-V semiconductor compound, separated from the regrown emitter region, the extrinsic base region having an extrinsic base region thickness, wherein the extrinsic base region thickness is greater than the intrinsic base region thickness and wherein, in use, the built-in potential of the emitter-base junction is less than 0.5 V, preferably less than 0.4 V.

According to a sixth aspect, a method for fabricating a heterojuction bipolar transistor is provided, comprising: providing a regrown emitter region; providing an intrinsic base region comprising a III-V semiconductor compound, to form, in use, a junction with the regrown emitter region, the intrinsic base region having an intrinsic base region thickness; providing an extrinsic base region comprising a III-V semiconductor compound, separated from the emitter region, the extrinsic base region having an extrinsic base region thickness, wherein the extrinsic base region thickness is greater than the intrinsic base region thickness and wherein, in use, the built-in potential of the junction is less than 0.5 V, preferably less than 0.4.

According to the fifth and sixth aspect of the present disclosure, the thickness of the extrinsic base portion of the device (i.e. the part outside the emitter area) is greater than the thickness of the intrinsic base portion of the device (i.e. the part beneath the emitter). This enables a significant decrease in base resistance, which is inversely proportional to the thickness of the extrinsic base layer, without sacrificing DC current gain (beta) and electron transit time through the base layer, which vary as the inverse square of the intrinsic base thickness. The result is a transistor that is capable of high transit frequency $f_t$ and high maximum frequency $f_{max}$ simultaneously, as $f_t$ is often limited by electron transit time through the base, and $f_{max}$ is often limited by the product of base resistance and base-collector capacitance. The transit frequency is a measure of the frequency at which the small signal current gain of the HBT is approximately unity. The maximum frequency of the transistor is the frequency at which the input power equals the output power.

In accordance with the present disclosure, the high frequency performance of low Vbi (where Vbi is the built-in potential of the HBT) HBTs (Vbi<0.5 V, preferably Vbi<0.4 V, and most preferably Vbi<0.3 V) is improved. In particular, the decoupling of the extrinsic base resistance from the intrinsic base transit time will enable high ft and high fmax simultaneously. Integrated circuits based on the device according to the present disclosure will be able to operate at high frequencies, while realizing the low power consumption benefits of low Vbi device technology.

In accordance with the present disclosure, the base of the HBT is made of a III-V semiconductor compound, i.e. a compound made with elements of the group III and group V of the periodic table of elements.

The device according to the present disclosure is consistent with the use of a selectively defined subcollector region (using, for example, ion implantation prior to epigrowth), as the one shown in U.S. Pat. No. 5,672,522, which is incorporated herein by reference in its entirety.

BRIEF DESCRIPTION OF THE DRAWINGS

The present disclosure will be understood and appreciated more fully from the following detailed description taken in conjunction with the drawings in which.

The present disclosure may be embodied in many different forms and should not be construed as limited to the embodiments set forth herein. Further, the dimensions of certain elements shown in the accompanying drawings may be exaggerated to more clearly show details. The present disclosure should not be construed as being limited to the dimensional relations shown in the drawings, nor should the individual elements shown in the drawings be construed to be limited to the dimensions shown.

DETAILED DESCRIPTION

1. First Epitaxial Growth

Figure 1:
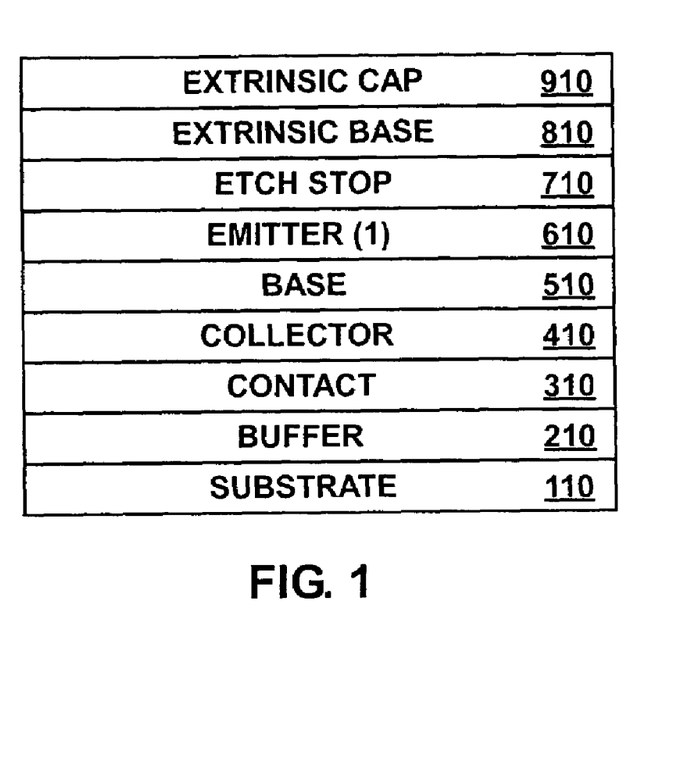
FIG. 1 shows a schematic representation of a layer sequence according to a first embodiment of the present disclosure.

FIG. 1 shows a schematic representation of a layer sequence according to a first embodiment of the present disclosure. The sequence comprises: a substrate layer 110; a buffer layer 210 above the substrate layer 110; a contact layer 310 above the buffer layer 210; a collector layer 410 above the contact layer 310; a base layer 510 above the collector layer 410; an emitter layer 610 above the base layer 510; an etch stop layer 710 above the emitter layer 610; an extrinsic base layer 810 above the etch stop layer 710; and an extrinsic cap layer 910 above the extrinsic base layer 810.

Figure 2:
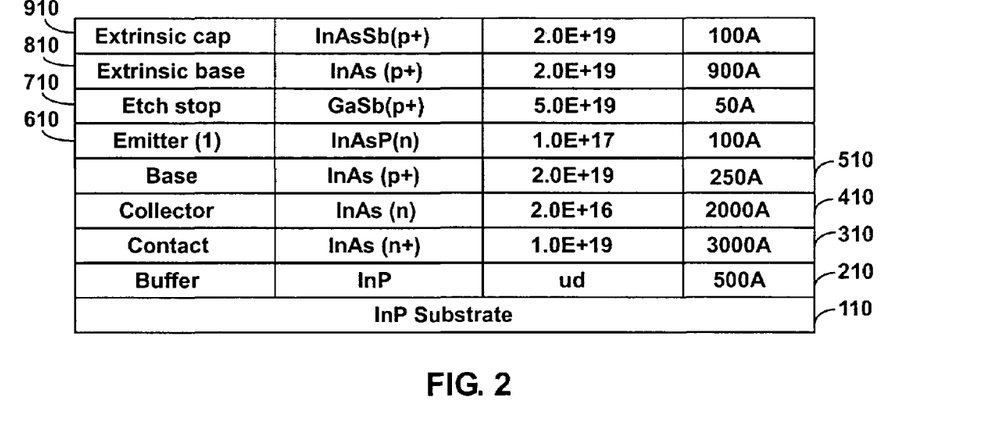
FIG. 2 shows a list of preferred materials, preferred doping concentrations and preferred thicknesses for some of the layers of FIG. 1.

FIG. 2 shows a list of preferred materials, preferred doping concentrations and preferred thicknesses for the layers 110-910 of FIG. 1. The abbreviation 'ud' means that the buffer layer 210 is undoped. Of course, alternative arrangements are possible. For example, the InAs layers can be replaced with $InAs_{1-x}P_x$, where the content of P is low, preferably x<0.25.

Figure 3:
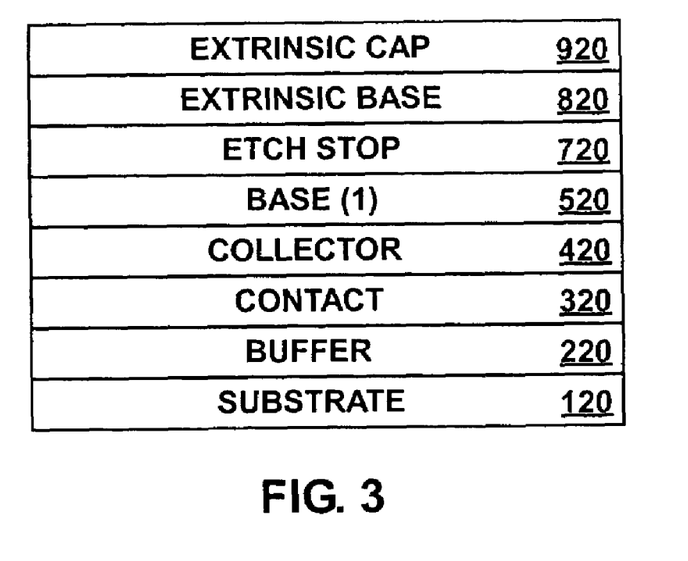
FIG. 3 shows a schematic representation of a layer sequence according to a second embodiment of the present disclosure.

FIG. 3 shows a schematic representation of a layer sequence according to a second embodiment of the present disclosure. The sequence comprises: a substrate layer 120; a buffer layer 220 above the substrate layer 120; a contact layer 320 above the buffer layer 220; a collector layer 420 above the contact layer 320; a base layer 520 above the collector layer 420; an etch stop layer 720 above the base layer 520; an extrinsic base layer 820 above the etch stop layer 720; and an extrinsic cap layer 920 above the extrinsic base layer 820.

Figure 4:
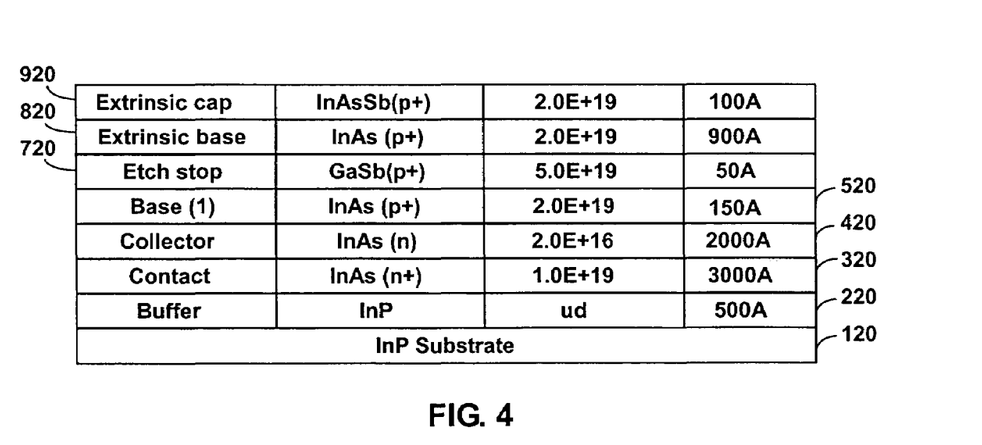
FIG. 4 shows a list of preferred materials, preferred doping concentrations and preferred thicknesses for some of the layers of FIG. 3.

FIG. 4 shows a list of preferred materials, preferred doping concentrations and preferred thicknesses for the layers 120-920 of FIG. 1. The abbreviation 'ud' means that the buffer layer 220 is undoped.

The sequences of FIGS. 1-4 are obtained by means of molecular beam epitaxy (MBE) or metal organic chemical vapor deposition (MOCVD).

The etch stop layer 710, extrinsic base layer 810, and extrinsic cap layer 910 of the first embodiment of FIGS. 1 and 2, and the etch stop layer 720, extrinsic base layer 820, and extrinsic cap layer 920 of FIGS. 3 and 4 are all p+ layers that will remain intact in the extrinsic base region of the finished device.

The substrate layer 110, 120 is made of a III-V compound which, preferably, is InP. GaAs, GaSb and InAs are possible alternatives.

The buffer layer 210, 220 is made of a III-V compound which, preferably, is InP.

The contact layer 310, 320 is made of a III-V compound which, preferably, is n+ doped InAs. InAsP, or high In content InGaAs are possible alternatives.

The base layer 510, 520 is made of a III-V compound which, preferably, is p+ doped InAs. InAs, InAsP grade, or high In content InGaAs are possible alternatives.

The emitter layer 610 is made of a III-V compound which, preferably, is n doped InAsP. High In content InAlAs is a possible alternative.

2. Etching

Following the epitaxial growth of the structure shown in FIGS. 1 and 2, the emitter region (intrinsic region) of the device according to the present disclosure is defined by opening holes in a dielectric mask and etching away the p+ layers 710, 810, 910 (first embodiment, FIGS. 1 and 2) or 720, 820, 920 (second embodiment, FIGS. 3 and 4). It should be noted that etching away of the etch stop layer 710 (first embodiment) or 720 (second embodiment) enables a precise location of the regrown interface. In particular, the regrown interface can be positioned in the emitter (first embodiment) or in the base (second embodiment). Further, also embodiments where the regrown interface is positioned at the emitter-base interface are possible.

3. Second Epitaxial Growth

Dielectric sidewall spacers are formed around the extrinsic base region. The wafer is then returned to an MBE or MOCVD epitaxial growth system for regrowth of an emitter sequence in the space obtained by opening the holes in the structure of FIGS. 1 and 3.

Figure 5:
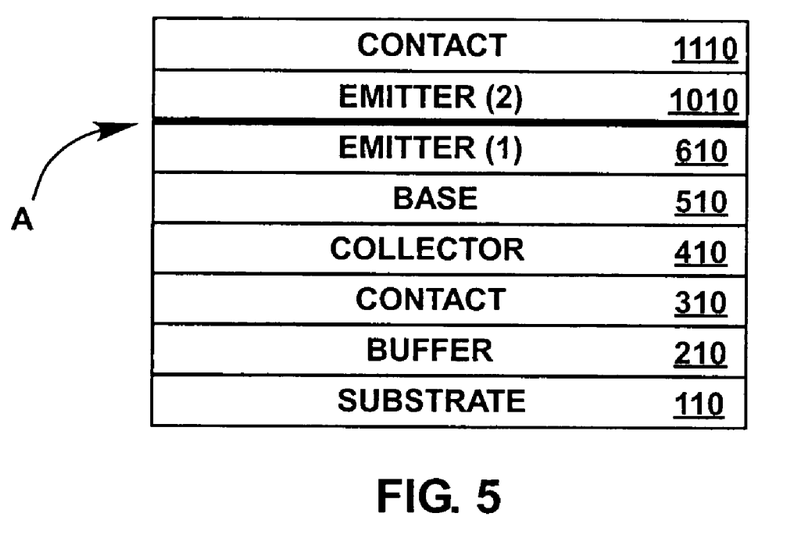
FIG. 5 shows a schematic representation of a regrowth layer sequence according to the first embodiment of the present disclosure.

FIG. 5 shows a schematic representation of a regrowth layer sequence according to the first embodiment of the present disclosure, where the layers 110-610 are the same as those shown in FIGS. 1 and 2, and where a regrowth interface is represented by arrow A. The regrowth sequence above the regrowth interface A comprises a second emitter layer 1010 and a contact layer 1110 above the second emitter layer 1010.

Figure 6:
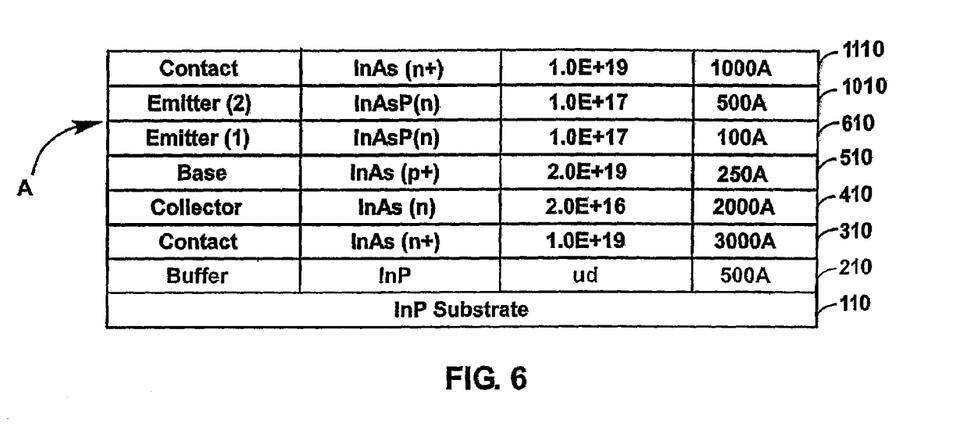
FIG. 6 shows a list of preferred materials, preferred doping concentrations and preferred thicknesses for some of the layers of FIG. 5.

FIG. 6 shows a list of preferred materials, preferred doping concentrations, and preferred thicknesses for the layers 110-510 below the regrowth interface A and the layers 1010, 1110 above the regrowth interface A.

Figure 7:
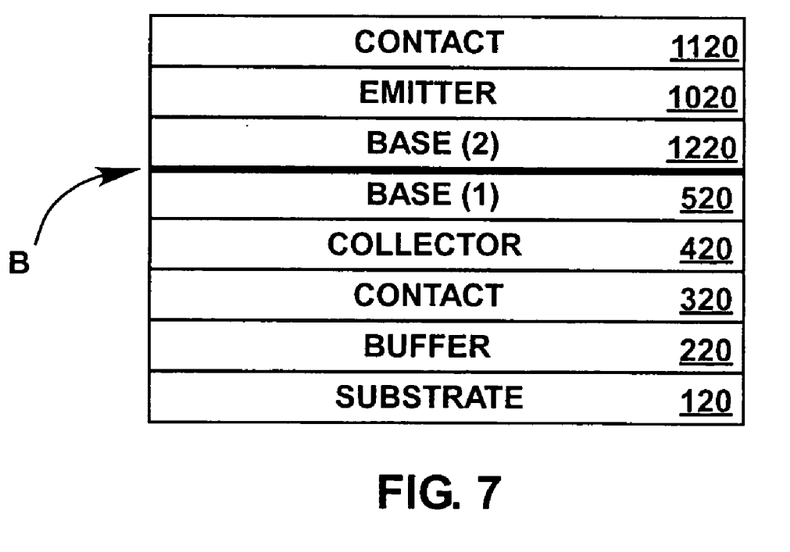
FIG. 7 shows a schematic representation of a regrowth layer sequence according to the second embodiment of the present disclosure.

FIG. 7 shows a schematic representation of a regrowth layer sequence according to the second embodiment of the present disclosure, where the layers 120-520 are the same as those shown in FIGS. 3 and 4, and where a regrowth interface is represented by arrow B. The regrowth interface above the regrowth interface B comprises a second base layer 1220, an emitter layer 1020 above the second base layer 1220, and a contact layer 1120 above the emitter layer 1020.

Figure 8:
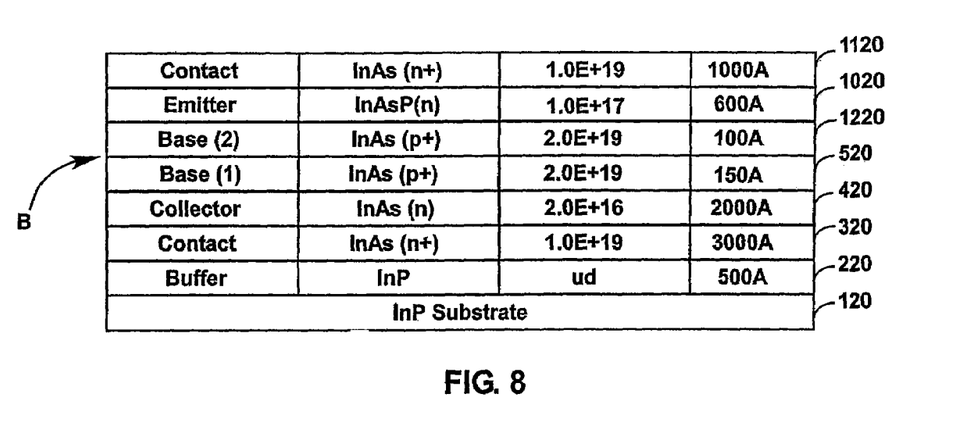
FIG. 8 shows a list of preferred materials, preferred doping concentrations and preferred thicknesses for some of the layers of FIG. 7.

FIG. 8 shows a list of preferred materials, preferred doping concentrations, and preferred thicknesses for the layers 120-520 below the regrowth interface B and the layers 1220, 1020, and 1120 above the regrowth interface A.

The base layer 1220 is made of a III-V compound which, preferably, is p+ doped InAs. InAs, InAsP grade, or high In content InGaAs are possible alternatives.

The emitter layers 1010, 1020 are made of a III-V compound which, preferably, is n doped InAsP. High In content InAlAs is a possible alternative.

The contact layers 1110, 1120 are made of a III-V compound which, preferably, is n+ doped InAs. InAsSb, InAsP, or high content In InGaAs are possible alternatives.

4. Completed Device

Figure 9:
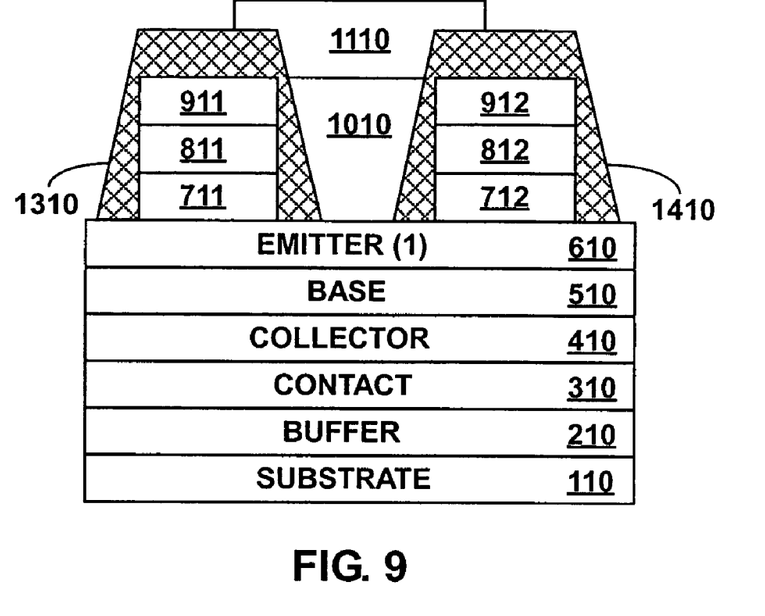
FIG. 9 shows a schematic cross sectional view of the completed device according to the first embodiment.
Figure 10:
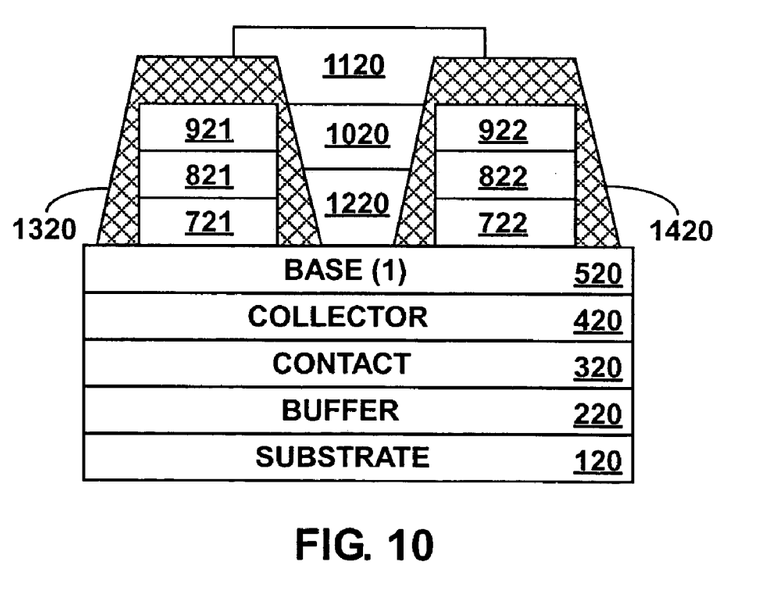
FIG. 10 shows a schematic cross sectional view of the completed device according to the second embodiment.

FIGS. 9 and 10 show schematic cross sectional views of the completed devices according to the first embodiment (FIG. 9) and the second embodiment (FIG. 10) with both intrinsic and extrinsic regions shown together. The collector contact has been omitted for simplicity.

In the region above the regrowth interface of FIG. 9, dielectric regions 1310 and 1410 are shown. A left three-layer region is located inside dielectric region 1310. The left three-layer region comprises an etch stop region 711, an extrinsic base region 811 above the etch stop region 711, and an extrinsic cap region 911 above the extrinsic base region 811. Further, a right three-layer region is located inside dielectric region 1410. The right three-layer region comprises an etch stop region 712, an extrinsic base region 812 above the etch stop region 712, and an extrinsic cap region 912 above the extrinsic base region 812. The region between the left dielectric region 1310 and the right dielectric region 1410 contains the layer sequence obtained in the second epitaxial growth, i.e. a second emitter region 1010 and a contact 1110.

The dielectric regions 1310, 1410 comprise a top portion and side portions. The top portion is formed before the etching stage, and is used as a mask to define the extrinsic regions. The dielectric can be made, for example, of silicon nitride, silicon oxide or another suitable material.

In the region above the regrowth interface of FIG. 10, dielectric regions 1320 and 1420 are shown. A left three-layer region is located inside dielectric region 1320. The left three-layer region comprises an etch stop region 721, an extrinsic base region 821 above the etch stop region 721, and an extrinsic cap region 921 above the extrinsic base region 821. Further, a right three-layer region is located inside dielectric region 1420. The right three-layer region comprises an etch stop region 722, an extrinsic base region 822 above the etch stop region 722, and an extrinsic cap region 922 above the extrinsic base region 822. The region between the left dielectric region 1320 and the right dielectric region 1420 contains the layer sequence obtained in the second epitaxial growth, i.e. a second base region 1220, and emitter 1020 and a contact 1120.

Once the structure shown in FIG. 9 or 10 is obtained, subsequent patterning and removal of excess material will be utilized to realize a final device structure with decoupled intrinsic and extrinsic base thicknesses.

The "intrinsic" part of the device shown in FIGS. 9 and 10 is the area where the transistor action takes place, i.e. the emitter/base junction and the base/collector junction. The "extrinsic" regions of the device shown in FIGS. 9 and 10 are those used to access the device. Usually, the extrinsic regions add resistances and capacitances that slow down the device.

In the embodiment of FIG. 9, the intrinsic base region of the device is formed by layer 510. On the other hand, the extrinsic base region is formed by layer 510, the etch stop regions 711/712, the extrinsic base regions 811/812 and the extrinsic cap regions 911/912. In the preferred embodiment, the thickness of layer 510 is 250 Angstrom, and the combined thickness of regions 811/911 or 812/912 is 1000 Angstrom. Therefore, the thickness of the intrinsic base region is less than the thickness of the extrinsic base region. It follows that the device is faster because its resistance is reduced.

In the embodiment of FIG. 10, the intrinsic base region of the device is formed by layer 520 and region 1220. On the other hand, the extrinsic base region is formed by layer 520 and regions 721/821/921 or 722/822/922. In the preferred embodiment, the thickness of layer 520 is 150 Angstrom, the thickness of region 1220 is 100 Angstrom, and the combined thickness of regions 821/921 or 822/922 is 1000 Angstrom. Therefore, also in this case, the thickness of the intrinsic base region is less than the thickness of the extrinsic base region, so that the device the faster because its resistance is reduced.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. A heterojunction bipolar transistor, comprising:
    a collector region;
    a base region made of a III-V semiconductor, above the collector region;
    a first emitter region above the first base region;
    a second emitter region above the first emitter region; and
    an extrinsic region outside the second emitter region and above the first emitter region, the extrinsic region comprising: an etch stop region; an extrinsic base region; and an extrinsic cap region.

2. The transistor of claim 1, wherein the first base region has a first thickness, and the extrinsic base region and extrinsic cap region combined have a second thickness, the first thickness being less than the second thickness.

3. The transistor of claim 1, further comprising a dielectric region separating the second emitter region from the extrinsic region.

4. The transistor of claim 3, wherein the dielectric region covers the extrinsic region in order to isolate the second emitter region from the extrinsic region.

5. The transistor of claim 1, further comprising a contact region above the second emitter region.

6. The transistor of claim 1, further comprising:
    a substrate region;
    a buffer region above the substrate region; and
    a contact region above the buffer region,
the substrate region, buffer region and contact region being below the collector region.

7. The transistor of claim 1, wherein, in use, the built-in potential of a junction between the first emitter region and the base region is less than 0.5 V.

8. A heterojunction bipolar transistor, comprising:
    a collector region;
    a first base region made of a III-V semiconductor, above the collector region;
    a second base region made of a III-V semiconductor, above the first base region;
    an emitter region directly overlying the second base region; and
    an extrinsic region outside the emitter region and above the first base region, the extrinsic region comprising: an etch stop region; an extrinsic base region; and an extrinsic cap region.

9. The transistor of claim 8, wherein the first base region and the second base region combined have a first thickness, and the first base region, the extrinsic base region and the extrinsic cap region combined have a second thickness, the first thickness being less than the second thickness.

10. The transistor of claim 8, further comprising a dielectric region separating the emitter region from the extrinsic region.

11. The transistor of claim 8, further comprising a contact region above the emitter region.

12. The transistor of claim 8, further comprising:
    a substrate region;
    a buffer region above the substrate region; and
    a contact region above the buffer region,
the substrate region, buffer region and contact region being below the collector region.

13. The transistor of claim 8, wherein, in use, the built-in potential of a junction between the first emitter region and the base region is less than 0.5 V.

14. A method for fabricating a heterojunction bipolar transistor, comprising:
    i) epitaxially growing a first layer sequence, the first layer sequence comprising:
        a collector layer;
        a base layer made of a III-V semiconductor, above the collector layer;
        a first emitter layer above the base layer;
        an etch stop layer above the first emitter layer;
        an extrinsic base layer above the etch stop layer; and
        an extrinsic cap layer above the extrinsic base layer,
    ii) etching away a portion of the first layer sequence thereby forming an etched away portion and a non-etched away portion of the first layer sequence, the etched away portion comprising:
        a portion of the etch stop layer;
        a portion of the extrinsic base layer; and
        a portion of the extrinsic cap layer,
    iii) epitaxially growing a second layer sequence, the second layer sequence comprising:
        a second emitter layer above the first emitter layer; and
        a contact layer above the second emitter layer.

15. The method of claim 14, further comprising: isolating the second layer sequence from the non-etched away portion of the first layer sequence.

16. The method of claim 14, wherein the first layer sequence further comprises:
    a substrate region;
    a buffer region above the substrate region; and
    a contact region above the buffer region,
the substrate region, buffer region and contact region being below the collector region.

17. A method for fabricating a heterojunction bipolar transistor, comprising:
    i) epitaxially growing a first layer sequence, the first layer sequence comprising:
        a collector layer;
        a first base layer made of a III-V semiconductor compound, above the collector layer;
        an etch stop layer above the first base layer;
        an extrinsic base layer made of a III-V semiconductor compound, above the etch stop layer; and
        an extrinsic cap layer above the extrinsic base layer,
    ii) etching away a portion of the first layer sequence thereby forming an etched away portion and a non-etched away portion of the first layer sequence, the etched away portion comprising:
        a portion of the etch stop layer;
        a portion of the extrinsic base layer; and
        a portion of the extrinsic cap layer,
    iii) epitaxially growing a second layer sequence, the second layer sequence comprising:
        a second base layer above the first base layer;

an emitter layer above the second base layer; and an emitter contact layer above the emitter layer.

18. The method of claim 17, further comprising: isolating the second layer sequence from the non-etched away portion of the first layer sequence.

19. The method of claim 17, wherein the first layer sequence further comprises:

a substrate region;

a buffer region above the substrate region; and a contact region above the buffer region, the substrate region, buffer region and contact region being below the collector region.

* * * * *